United States Patent
Yang et al.

(10) Patent No.: US 9,224,803 B2
(45) Date of Patent: Dec. 29, 2015

(54) FORMATION OF A HIGH ASPECT RATIO CONTACT HOLE

(71) Applicant: Macronix International Co., Ltd., Hsinchu (TW)

(72) Inventors: Zusing Yang, Hsinchu (TW); Fang-Hao Hsu, Hsinchu (TW); Hong-Ji Lee, Taoyuan County (TW)

(73) Assignee: Macronix International Co., Ltd., Hsinchu (TW)

(*) Notice: Subject to any disclaimer, the term of this patent is extended or adjusted under 35 U.S.C. 154(b) by 98 days.

(21) Appl. No.: 13/875,998

(22) Filed: May 2, 2013

(65) Prior Publication Data

US 2014/0264782 A1   Sep. 18, 2014

Related U.S. Application Data

(60) Provisional application No. 61/778,529, filed on Mar. 13, 2013.

(51) Int. Cl.
*H01L 23/58* (2006.01)
*H01L 29/06* (2006.01)
*H01L 23/485* (2006.01)
*H01L 21/768* (2006.01)

(52) U.S. Cl.
CPC .......... *H01L 29/06* (2013.01); *H01L 21/76816* (2013.01); *H01L 23/485* (2013.01); *H01L 2924/0002* (2013.01)

(58) Field of Classification Search
CPC .............. H01L 29/0649; H01L 21/76877; H01L 21/76224; H01L 23/481; H01L 21/76802
USPC ............ 257/640, 635, E21.257, E21.579
See application file for complete search history.

(56) References Cited

U.S. PATENT DOCUMENTS

| | | | |
|---|---|---|---|
| 5,953,629 A * | 9/1999 | Imazeki et al. | 438/679 |
| 7,365,021 B2 * | 4/2008 | Kim et al. | 438/745 |
| 2003/0166345 A1 * | 9/2003 | Chang | 438/717 |
| 2006/0199379 A1 * | 9/2006 | Yeh et al. | 438/638 |

* cited by examiner

*Primary Examiner* — Andy Huynh
(74) *Attorney, Agent, or Firm* — Fish & Richardson P.C.

(57) ABSTRACT

A small contact hole having a large aspect ratio is formed by employing a stop layer with a trench formed therein. A relatively large contact hole is formed above the trench, and the small contact hole is formed below the trench, using properties of the trench and the stop layer to limit the size of the small contact hole.

15 Claims, 4 Drawing Sheets

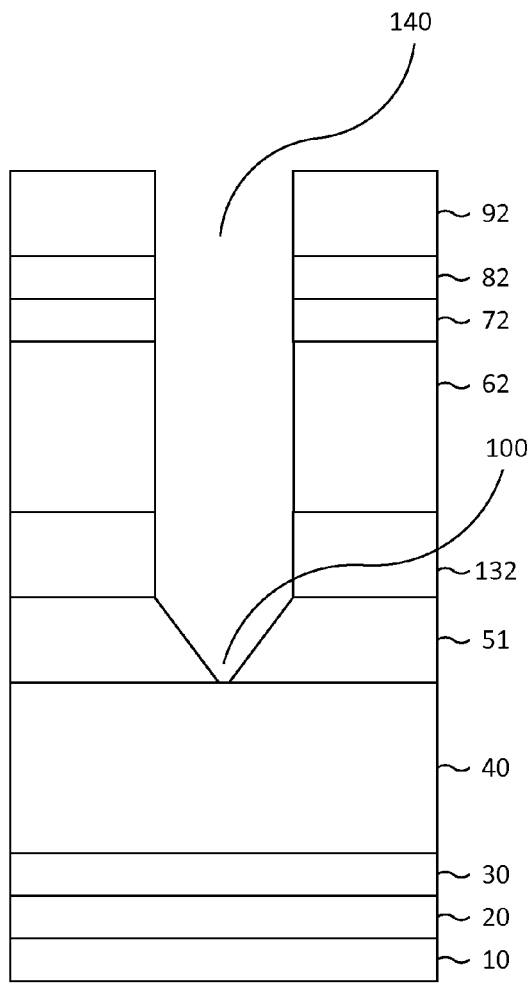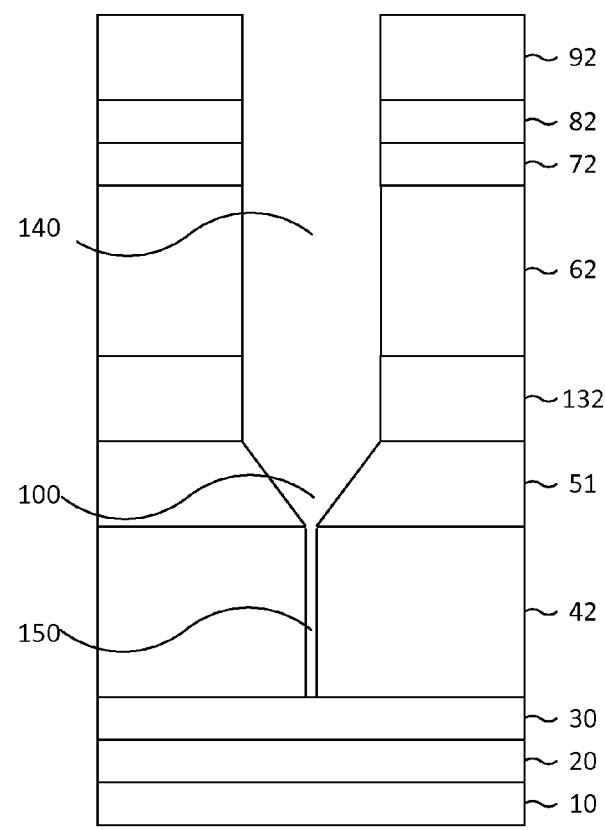
FIG. 5         FIG. 6

FORMATION OF A HIGH ASPECT RATIO CONTACT HOLE

CROSS-REFERENCE TO RELATED APPLICATIONS

This application claims the benefit of U.S. Provisional Application No. 61/778,529 filed on Mar. 13, 2013 and entitled FORMATION OF A ASPECT RATIO CONTACT HOLE, the entire contents of which are hereby incorporated by reference.

BACKGROUND OF THE INVENTION

1. Field of the Invention

The present invention relates generally to semiconductor fabrication methods and structures and, more particularly, to formation of a small contact hole with a high aspect ratio.

2. Description of Related Art

Current memory products may have a multi-layered, i.e., three-dimensional, structure that requires interconnection between elements on layers that are separated from each other by insulating material. For example, providing a connection between a first element disposed on a first layer and a second element disposed on a second layer may be achieved by disposing a contact hole between the first and second elements, the term "contact hole" being generic for a semiconductor etch of interest. Once the contact hole is in place, filling the contact hole with conductive material (e.g., metal) may provide the desired electrical interconnection between the first and second elements. When a length, L, separates the first and second elements, and when a contact hole between them has a width, w, then an aspect ratio of the contact hole may be defined as a quotient, L/w.

As memory products become smaller, integrated circuit elements necessarily become more closely spaced, thus requiring formation of contact holes with reduced cross-sectional areas and/or increased relative lengths. Each of these possibilities corresponds to an increase in the aspect ratio, L/w. Other things being equal, the increase in aspect ratio necessarily results in a decrease in conductance of a connection, with conductance being given by $\sigma A/L$ in which $\sigma$ is the conductivity of the conductive material used to fill the contact hole and the cross-sectional area, A, of the contact hole generally decreasing as the square of the width, w.

High-aspect-ratio contact holes create fabrication difficulties in at least two ways. First, formation of the holes can be difficult because of their smaller geometry. For instance, the sidewall shape may suffer from a defect during etching such as via creation of a sub-optimal (e.g., reentrant) profile on the interior wall of the contact hole. Second, filling the smaller and/or longer holes with conductive material (e.g., metal) can become increasingly difficult with miniaturization because of known limiting factors such as stoichiometric/geometrical/dimensional considerations involved in uniformly and completely filling (e.g., by vapor deposition) all operational regions, including those deepest, of the contact hole with a suitably conductive material. As an example, a sub-optimal profile on the interior wall of a contact hole can cause partial failure in the filling of the contact hole in the subsequent processing of forming an electrically conductive layer. An improperly or incompletely filled contact hole may result in reduced or improper conductance of a connection, which in extreme cases may create an unacceptable condition known as a blind contact.

A need thus exists in the prior art for a method of reliably forming a relatively small contact hole which has a relatively high aspect ratio yet is capable of performing according to ever increasing stringent operational requirements. Along that vein, methods for filling small contact holes with conductive material should be implemented in manners no as to avoid blind contact issues.

SUMMARY OF THE INVENTION

The present invention addresses these needs by providing a method of fabricating a contact hole having a high aspect ratio. According to an implementation of the invention herein disclosed, a semiconductor film stack is provided, the film stack having a first plurality of layers, which layers may include a contact layer, and disposing a stop layer over the first plurality of layers. A trench may be introduced into the stop layer, the trench having an upper width and a lower width, the lower width being less than the upper width, and a second plurality of layers may be placed above the stop layer.

An implementation of the method may comprise forming a relatively large contact hole through the second plurality of layers, the large contact hole being disposed above, aligned with and extending downward to an upper extent of the trench, the large contact hole having a cross-section substantially the same as the upper width of the trench. Material may be removed from the trench, and a relatively small contact hole may be formed through the first plurality of layers below and extending from a lower extent of the trench to the contact layer, the small contact hole being aligned with and having a cross-section substantially the same as the lower width of the trench.

An embodiment of the present invention may include a semiconductor film stack formed of a plurality of layers, which may comprise photoresist, advanced patterning film, oxide, and a stop layer. According to a particular embodiment, the plurality of layers may comprise a first plurality of layers having a contact layer, a second plurality of layers that may be disposed above the first plurality of layers, and the stop layer, which may be disposed between the first plurality of layers and the second plurality of layers. The stop layer may have introduced therein a trench having an upper width and a lower width, the tower width being smaller than the upper width. A relatively large contact hole may be disposed in the second plurality of layers, above the trench, aligned with the trench, extending downward to an upper extent of the trench and having a cross-section substantially the same as the upper width of the trench. Still further, the semiconductor film stack may comprise a relatively small contact hole disposed in the first plurality of layers, the small contact hole being disposed below the trench, aligned with the trench, extending downward from a lower extent of the trench to the contact layer and having a cross-section substantially the same as the lower width of the trench.

While the apparatus and method has or will be described for the sake of grammatical fluidity with functional explanations, it is to be expressly understood that the claims, unless indicated otherwise, are not to be construed as limited in any way by the construction of "means" or "steps" limitations, but are to be accorded the full scope of the meaning and equivalents of the definition provided by the claims under the judicial doctrine of equivalents.

Any feature or combination of features described or referenced herein are included within the scope of the present invention provided that the features included in any such combination are not mutually inconsistent as will be apparent from the context, this specification, and the knowledge of one skilled in the art. In addition, any feature or combination of features described or referenced may be specifically excluded from any embodiment of the present invention. For purposes of summarizing the present invention, certain aspects, advantages and novel features of the present invention are described or referenced. Of course, it is to be understood that not necessarily all such aspects, advantages or features will be embodied in any particular implementation of the present invention. Additional advantages and aspects of the present invention are apparent in the following detailed description and claims that follow.

BRIEF DESCRIPTION OF THE FIGURES

FIG. 5 pictorially describes a result of performing an etch step, thereby forming a relatively large contact hole in the structure of FIG. 4;

FIG. 6 illustrates a small contact hole having a large aspect ratio formed by performing a further etch step on the structure of FIG. 5.

DETAILED DESCRIPTION OF THE PRESENTLY PREFERRED EMBODIMENTS

Figure 1:
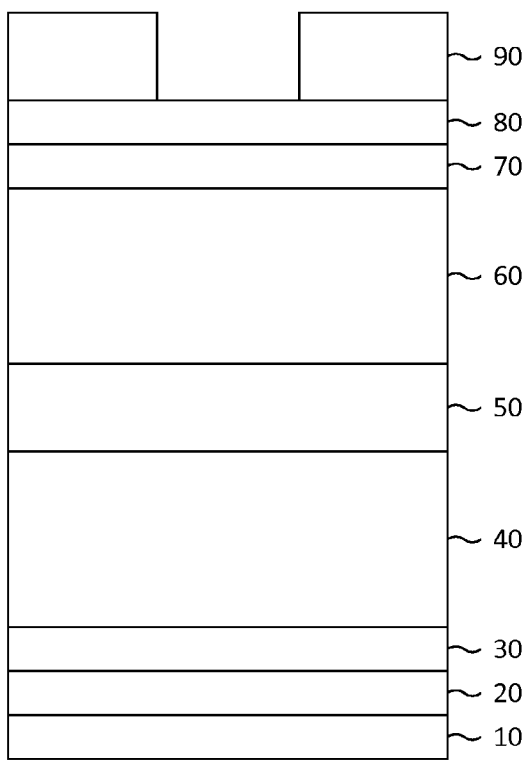
FIG. 1 is an illustration of a cross-section of a stack of representative film layers that may be employed in semiconductor fabrication.

Embodiments of the invention are now described and illustrated in the accompanying drawings, instances of which are to be interpreted to be to scale in some implementations while in other implementations, for each instance, not. In certain aspects, use of like or the same reference designators in the drawings and description refers to the same, similar or analogous components and/or elements, while according to other implementations the same use should not. According to certain implementations, use of directional terms, such as, top, bottom, left, right, up, down, over, above, below, beneath, rear, and front, are to be construed literally, while in other implementations the same use should not. The present invention may be practiced in conjunction with various integrated circuit fabrication and other techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to formation of a contact hole having a high aspect ratio and a related method of manufacture.

Referring more particularly to the drawings, FIG. 1 is a cross-sectional illustration of a representative stack of layers that may comprise a portion of a semiconductor structure. The particular example shown in the figure comprises a substrate, which may be a silicon substrate (not shown), beneath a zero oxide layer 10 (which may be formed using, e.g., a thin-film related manufacturing process to a thickness of about 200 Å). The zero oxide layer 10 may create an Athena key, which may provide improved accuracy, precision, and/or correction in the photo-related manufacture. Disposed above the zero oxide layer 10 is an oxide layer 20, which may be formed by a process related to thin-film manufacture, the oxide layer 20 being followed by a first silicon nitride (SIN) layer 30. The oxide layer 20 may function as an obstacle layer between the SIN layer 30 and the substrate. A layer of borophosphosificate glass (BPSG) 40 and a second SIN layer 50 may be formed (e.g., deposited) sequentially on the oxide layer 20.

The oxide layer 20 may be formed of one of various oxides, which may include, for example, BPSG or High Density Plasma (HDP) oxide, an important consideration in choice of oxide being enablement of superior step-coverage on the SIN layer 30. In the illustrated embodiment, the oxide layer 20 (i.e., obstacle layer) may be formed using a thin-film related process of manufacture to a thickness of about 100 Å. The first SIN layer 30 may be deposited on the oxide layer 20 using, e.g., a diffusion-related manufacturing process, the first SIN layer 30 functioning as a stop layer for chemical mechanical planarization (GNU). The thickness of the SIN deposit may be about 200 Å, for example. The BPSG layer 40 may be formed (e.g., deposited) on the first SIN layer 30 using a thin-film related manufacturing process to a thickness of about 6500 Å, according to one example. Although the BPSG layer 40 may alternatively be replaced with a layer of HDP, a preference for BPSG material may exist owing to its excellent shadowing or step coverage of the SIN layer 30. The second SIN layer 50, comprising, e.g., $Si_3N_4$, SiCN or a Cu-doped silicon nitride, may be formed using a diffusion-related manufacturing process to a thickness ranging from about 200 Å to about 1000 Å, for example, to function as a stop layer for an ensuing etch process to be described below.

Continuing with the construction, the second SIN layer 50 may have deposited thereon an advanced patterning (APF) layer 60. Upper layers formed on the APF layer 60 may include a dielectric anti-reflective coating (DARC) layer 70, a bottom anti-reflective coating (BARC) layer 80, and a patterned photoresist (PR) layer 90. Here, the anti-reflective layers, such as the described DARC layer 70. BARC layer 80, and APF layer 60, may function to improve the precision control of subsequent photo-mask patterning.

According to an implementation of the present invention, it is desired to form a contact hole through a structure similar to any of the parts of FIG. 1, whereby the contact hole advantageously possesses minimal dimensions yet is reliably able to reach (e.g., to terminate on) a tower layer, e.g., the first SIN layer 30. Forming a narrow contact hole with a relatively large aspect ratio, for instance, may be opportune in sundry circumstances, such as when constructing a contact hole in a narrow space, e.g., between cobalt silicide lines.

Figure 2:
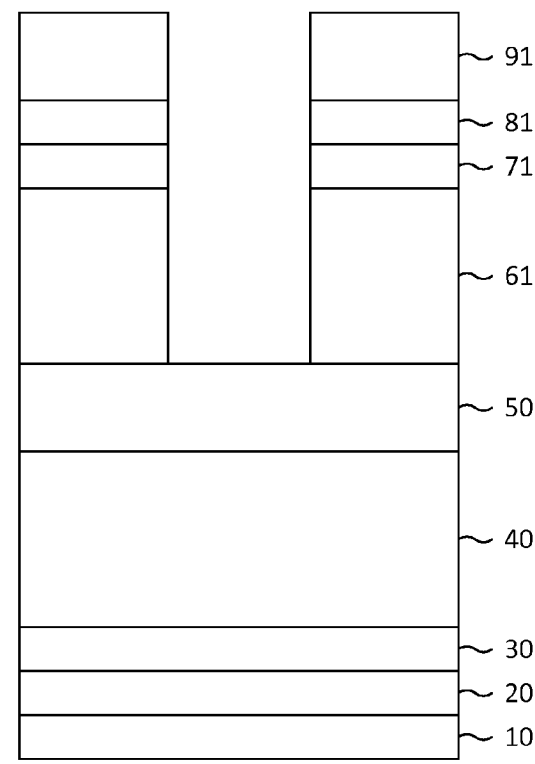
FIG. 2 is a pictorial representation of the stack of FIG. 1 with portions of upper layers removed.

The result of an intermediate step in forming a contact hole as just described may appear in the arrangement illustrated in FIG. 2, wherein portions of one or more of the PR layer 90, the BARC layer 80, the DARC layer 70, and the APF layer 60 of FIG. 1 may be removed (e.g., etched) to form, respectively, one or more modified layers of PR 91, BARC 81, DARC 71, and APF 61. That is, the BARC 80, DARC 70, and APF 60 layers are opened by an etch-related manufacturing process in preparation for forming a SIN trench in the second SIN layer 50. Processing (e.g., opening) of BARC 80, DARC 70, and APF layer 60 into BARC 81, DARC 71, and APF 61 may provide a hard mask in order to facilitate formation of a trench 100 (cf. FIG. 3B) in the SIN layer 50.

This providing of a hard mask and/or the formation of a trench 100 may comprise over etching, e.g., as a continuance of the above-discussed removal, e.g., etch, in which the etchant, e.g., plasma etchant, has a greater selectivity for the upper layer(s), e.g., APF layer 60 and/or oxide, as compared to a selectivity for SIN layer 50. For instance, the etchant can have a greater etch rate for APF layer 60 over SIN layer 50 whereby the SIN layer 50 serves as a stop layer followed by continuance of the etch (e.g., via over-etching) results in a more gradual and/or controllable removal of parts of SIN layer 50 to form/format a trench 100.

Figure 3A:
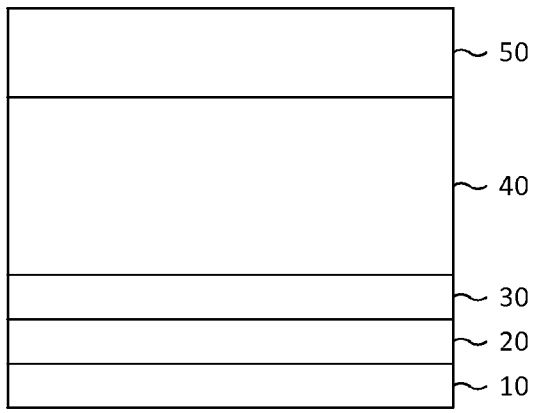
FIG. 3A depicts a stack of film layers corresponding to the base components of the prior figures.

FIG. 3A portrays a stack of film layers corresponding to base structures, e.g., of the prior figures, in which upper layers such as shown in FIG. 2 are not present (e.g., having been removed by way of a sequence of process steps such as dry/wet strips, and/or by virtue of not ever having been formed).

Figure 3B:
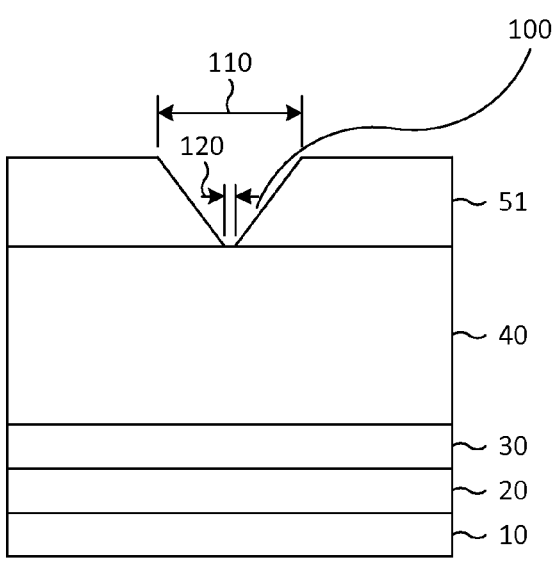
FIG. 3B illustrates the stack of FIG. 3A with a trench introduced into an upper layer of the structure.

Turning to FIG. 3B, a SIN trench etch step, e.g., the above-described over etch, introduces the trench 100 into the second SIN layer 50 of the structure for instance of FIG. 2 by performing an etch such as by using the anti-reflective BARC 81, DARC 71, and APF 61 layers as a hard mask. The result of these process steps may appear as a modified (e.g., shaped) second. SIN layer or stop layer 51. An exemplary sequence of process steps for creating the shaped stop layer 51 with trench 100 includes, in order, a BARC etch, a DARC etch, an APF etch, and a SIN trench etch, e.g., over etch, using the PR layer 90 as a hard mask. The SIN trench etch can be tailored to form, e.g., via an over etch, the trench 100 by using a relatively lower SIN etch rate. Because the SIN etch rate is slower, the etching direction can be harnessed to provide a taper with relative ease. As a result, the trench structure is able to be formed, and done so, e.g., formatted, in a relatively highly controllable fashion.

Preferably, as mentioned, the etch steps may comprise an over-etch and/or be performed using one or more etchants having a lower selectivity for the shaped stop layer 51 (e.g., for SIN, to form the trench 100) as compared to that for the APF layer 60 and/or the BPSG layer 40. Generally, the APF etching baseline (e.g., $COS/O_2$) can be implemented to comprise a much lower etch rate for the SIN layer. For instance, an over-etch at the end of or following the FIG. 2 main etch may affect (e.g., partially or fully form, or enlarge) trench 100 and/or openings the in layers thereabove. Typically, the main etch may conclude with over-etching that may affect (e.g., slightly or nominally enlarge) the gap of the PR layer 90 while contributing less to or not affecting a characteristic (e.g., a width) of the trench 100.

FIG. 3B shows an arrangement corresponding to the upper layers formed in FIG. 2 having been removed by way of a sequence of process steps such as dry/wet strips an example being a dry strip (e.g., an $O_2$ ash). On the other hand, the structure of FIG. 3A may be used to form a modified (e.g., shaped) second SIN layer or stop layer 51 by way of processes other than that elucidated by the flow from FIG. 2 to FIG. 3B. For instance, the over-etch can be replaced by another etching behavior having lower selectivity toward SIN (e.g., than for oxide). Owing to the etching ability to SIN not being stronger, the trench 51 can be optimally formatted.

Surfaces defining the trench 100 in FIG. 3B may be formed to have a bowing shape, a vertical portion, and/or a reentrant shape. As embodied herein, the trench 100 has an upper width 110 (e.g., measured at the top, which may be referred to as an upper extent, of the trench 100) and a lower width 120 (e.g., measured at the bottom, which may be referred to as a tower extent, of the trench 100) that is different in one or more of orientation and dimension from the upper width. In the illustrated embodiment, e.g., with orientations and dimensions as shown, the lower width 120 is smaller than the upper width 110 (e.g., about 5 percent smaller to about 95 percent smaller), the width 110 determining the final size of the contact hole. Preferably, or in some instances, the upper-width to lower-width size ratio is between about 110 and 120.

Figure 4:
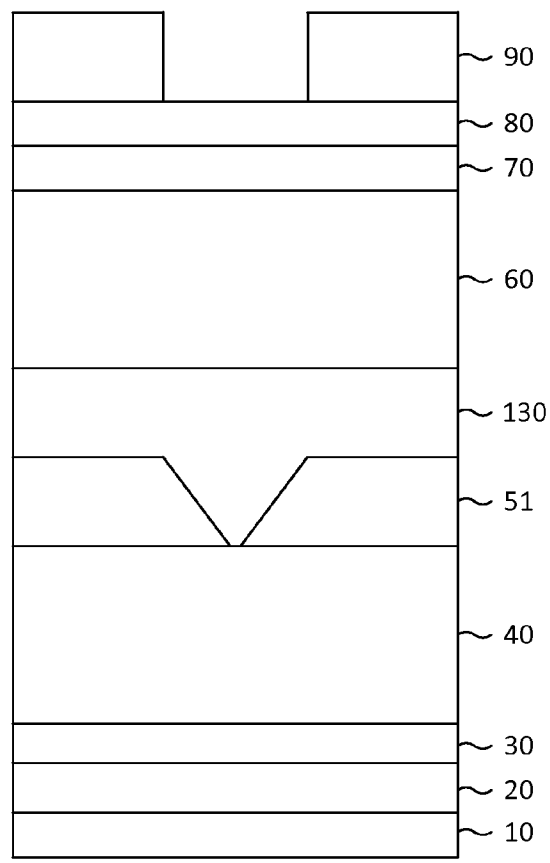
FIG. 4 is a diagram showing a semiconductor film stack formed by depositing additional layers onto the structure of FIG. 3B.

Additional layers may be sequentially deposited onto the structure of FIG. 3B (e.g., one or more of the original layers are deposited again) yielding, according to the embodiment, the structure diagrammed in FIG. 4. In this instance, a second BPSG layer 130 is deposited above the shaped stop layer 51, thereby filling the trench 100 (FIG. 3B) with BPSG material according to the illustrated embodiment and a feature of the invention. For instance, the raw material of BPSG layer 130 can be the same as that used previously in the described process.

In comparison with FIG. 1, additional layers which may be deposited onto the BPSG layer 130, e.g., via thin film related and photo-related manufacturing, may similarly include an APF layer 60 and anti-reflective layers, e.g., DARC layer 70, and a BARC layer 80. A patterned PR layer 90 may be formed over the anti-reflective DARC layer 70 and BARC layer 80.

Progressing in the sequence, according to a feature of the invention, as a step preparatory to the forming a small contact hole 150 (FIG. 6), a material removal may be performed on the structure of FIG. 4 to create a relatively large contact hole 140 as depicted in FIG. 5. An oxide etch may be used to implement this preparatory step. The relatively large contact hole 140 may be formed by etching the PR layer 90, the BARC layer 80, the DARC layer 70, the APF layer 60 (FIG. 4) using processing such as mentioned above. Removal of parts of the BPSG layer 130 (FIG. 4) above and/or within trench 100 may be accomplished as a continuance of the etching activity, using, e.g., etch steps already described or known in the art, and/or may be effectuated in the context of another (e.g. ensuing) action, infra.

The preceding activity, which may include a hard mask etch, may result in a respective set of modified layers PR 92, BARC 82, DARC 72, APF 62, and BPSG 132. Regarding that etch, the shaped stop layer 51 may prevent the erosion of material from progressing into the BPSG layer 40, although BPSG material is removed from the trench 100.

The size and shape of the SIN trench 100 may determine a size of a high aspect ratio contact hole formed in a subsequent step. To this end, tapered sidewalls of the SIN trench 100 may be formed by performing an etch step with a relatively low selectivity toward SIN as compared to that of BPSG. The larger contact hole 140 is relatively easily prepared because of its relatively large size, and, having a larger width, its preparation may aid in reducing incidence or extent of blind contacts.

According to a typical embodiment, the large contact hole 140 may have a critical dimension (e.g., a cross-sectional size) that may range from about 10 nm to about 200 nm. Further, the large contact hole 140 may have surfaces of a shape that is bowing, vertical, and/or reentrant. Such a re-entrant structure may arise, for example, when a structure is created by more than one step carried out on more than one machine.

Continuing with the exemplary, implementation from FIG. 5 to another intermediate arrangement, FIG. 6 illustrates a result of an additional etch step in the sequence for forming a structure having a small contact hole 150 with a high aspect ratio.

Because of the existence of the shaped stop layer 51, clear gas chemistry (e.g., using plasma gases as elucidated, infra), can be applied in this etch step to form a high aspect ratio contact hate. Such application may reduce the incidence or extent of forming a blind contact that often is associated with smaller contact holes. The material of the trench 100 may function as a stop layer for the etch process that creates the larger contact hole, and the narrow width 120 (FIG. 4) of the bottom of the trench 100 may permit a smaller and more vertical contact hole to be formed in the BPSG layer 40 with a higher aspect ratio than can be obtained using prior art methods. The cross-sectional size of the small contact hole 150 may be controlled by the lower width 120 (FIG. 3B) of the trench 100 in the shaped stop layer 51 in this determinative etch step. A critical dimension of the small contact hole 150 may range in typical implementations from about 10 nm to about 100 nm and/or an aspect ratio may vary from about 10 to about 200. A sidewall shape of the small contact hole 150 may comprise one or more of a bowing, a vertical and/or a reentrant characteristic (e.g., topography).

Figure 7:
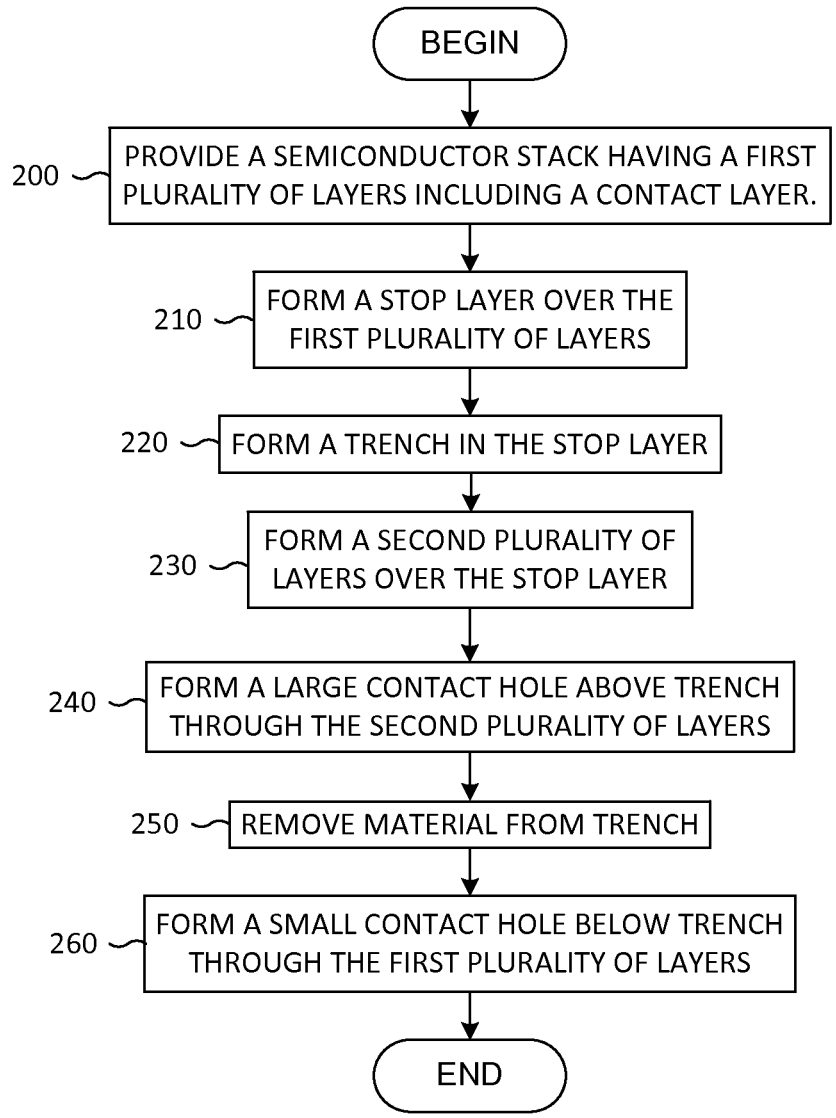
FIG. 7 is flow diagram that summarizes a method of forming a small contact hole according to the present invention.

A feature of the present invention may comprise a method of fabricating a small contact hole having a large aspect ratio according to characteristics set out above. One implementation of such a method, as summarized in the flow diagram of FIG. 7, may comprise providing a semiconductor film stack at step 200. The film stack may include, referring to FIG. 3A as one example, a first plurality of sequentially formed layers comprising a zero oxide layer 10, an oxide layer 20, a first SIN layer 30, and a BPSG layer 40, wherein the first SIN layer 30 may serve as a contact layer.

A second SIN layer 50 may be disposed over the first plurality of layers at step 210, and a trench 100 (FIG. 3B) may be introduced into the second SIN layer 50 at step 220, thereby forming a shaped stop layer 51. The trench 100 may be formed by a step using an etch process that is highly selective toward BPSG as compared to SIN.

The trench 100 may be formed with an upper width 110, which may range from about 10 nm to about 200 nm a typical embodiment. As set forth above, the trench 100 may be bowing, vertical or reentrant in shape. According to another aspect of the present invention, the trench 100 may have a bottom width 120 that may range from about 10 nm to about 200 nm.

Following placement of the first plurality of layers 10, 20, 30, 40, second SIN layer 50 (FIG. 3A), and introduction of the trench 100 (FIG. 3B), which may form the shaped stop layer 51, a second plurality of layers may be disposed over the shaped stop layer 51 at step 230. The forming of the second plurality of layers, as illustrated in FIG. 4, may comprise depositing another BPSG layer 130 to fill the trench 100 and, additionally, may include depositing additional layers comprising, for example, an APF layer 60, a DARC layer 70, a BARC layer 80, and a patterned PR layer 90 above the BPSG layer 130.

At step 240a relatively large contact hole 140 (FIG. 5) may be formed above and aligned with the upper width 110 (cf. FIG. 3B) of the trench 100 through the second plurality of layers. The forming may be accomplished, e.g., by patterning and etching the material of the second plurality of layers using known techniques. This etching step may effectively remove BPSG material from the trench 100 at step 250, resulting in a shaped stop layer 51 that may function as a stop layer for a subsequent etch step. In modified embodiments, the shaped stop layer 51 may be formed of $Si_3N_4$, SiCN, or Cu-doped silicon nitride. A width of a cross-section of the large contact hole may be substantially the same as the upper width 110 of the trench 100 (FIG. 4).

A relatively small contact hole 150 (FIG. 6) having a cross-section with a width substantially the same as the lower width 120 of the trench 100 (FIG. 3B) may then be formed below and aligned with the lower width 120 of the trench 100 at step 260. This forming may be accomplished via a continuance of the etching activity, using, e.g., etch steps already described or known in the art, and/or may be effectuated in the context of another (e.g., ensuing) action and/or via an etching step that may employ, for example, plasma gases such as $C_4F_8$, $C_5F_8$, $CH_2F_2$, $CHF_3$ or $O_2$. For the etch of a high aspect ratio contact hole, a higher concentration of $O_2$ can be applied to the etching plasma in order to reduce incidence of a blind contact based upon the fact that the higher $O_2$ concentration can result in more complete removal of carbon residue.

In a typical application, a semiconductor device or element such as a source or drain of a metal-oxide-semiconductor field effect transistor (MOSFET) is formed in a part of a semiconductor substrate, which is exposed to an upper layer through the contact hole. The contact hole can be filled with a conductive material to make an electrical connection with, for example, an element on an upper interconnection level. To the extent that a conductive metal cannot readily fill a relatively smaller hole (e.g., a 50 nm contact hole), it is expected that the fill-in can be more readily and reliably accomplished by use of the larger hole (e.g., entrance portion) according to a feature of the invention.

The invention just described may provide a simple approach for preparing a narrow contact hole having a high aspect ratio. The employment of this invention may reduce incidence of blind contacts in highly dense semiconductor applications that may arise in contact processes required in fabrication of for example, DARM, NOR flash and NAND flash devices. In fact, many contact-related etch technologies in multiple oxide/polysilicon structures or semiconductor processes in general may benefit from this invention. The present invention may contribute to miniaturization of semiconductor products by facilitating formation of small contact holes in semiconductor devices such as DRAM, NOR flash and 3D NAND flash and may simplify formation of contact holes in limited space found between, e.g., thin lines formed of cobalt silicide. The invention, further, may improve ease of filling in conductive metal into a high-aspect-ratio contact hole. More complete fill-in may result in higher conductance of connections than is obtained using prior art methods due to the larger entrance provided by the larger contact hole 140 (FIG. 6).

Although the disclosure herein refers to certain illustrated embodiments, it is to be understood that these embodiments have been presented by way of example rather than limitation. The intent accompanying this disclosure is to have such embodiments construed in conjunction with the knowledge of one skilled in the art to cover all modifications, variations, combinations, permutations, omissions, substitutions, alternatives, and equivalents of the embodiments, to the extent not mutually exclusive, as may fall within the spirit and scope of the invention as limited only by the appended claims.

What is claimed is:

1. A semiconductor film stack having a contact structure, comprising:
   a first plurality of layers having a top surface and a contact layer;
   a second plurality of layers having a bottom surface, the second plurality of layers being disposed above the first plurality of layers;
   a shaped stop layer disposed between the first plurality of layers and the second plurality of layers, wherein the shaped stop layer has formed therein a trench having tapered sidewalls, the tapered sidewalls extending through the entire shaped stop layer from the bottom surface of the second plurality of layers to the top surface of the first plurality of layers, the trench having an upper width and a lower width, the lower width being smaller than the upper width;
   a relatively large contact hole extending through the second plurality of layers; and a relatively small contact hole extending downward from a lower extent of the trench to an upper extent of the contact layer, the small contact hole having a cross-section substantially the same as the lower width of the trench.

2. The semiconductor film stack as set forth in claim 1, wherein the large contact hole is disposed above the trench, aligned with the trench, extends downward to an upper extent of the trench and has a cross-section substantially the same as the upper width of the trench.

3. The semiconductor film stack as set forth in claim 2, wherein:
   a critical dimension of the large contact hole ranges from about 10 nm to about 200 nm; and
   a shape of the large contact hole is bowing, vertical or reentrant.

4. The semiconductor film stack as set forth in claim 3, wherein the small contact hole is disposed below the trench and is aligned with the trench.

5. The semiconductor film stack as set forth in claim 4, wherein:
   a critical dimension of the small contact hole ranges from about 10 nm to about 100 nm; and
   a shape of the small contact hole is bowing, vertical or reentrant.

6. The semiconductor film stack as set forth in claim 4, wherein an aspect ratio of the small contact hole ranges from about 10 to about 200.

7. The semiconductor film stack as set forth in claim 1, wherein the first plurality of layers comprises:
   a zero oxide layer;
   an oxide layer disposed above the zero oxide layer;
   a first silicon nitride layer disposed above the oxide layer; and
   one of a borophosphosilicate glass layer and a high-density plasma oxide layer disposed above the first silicon nitride layer.

8. The semiconductor film stack as set forth in claim 7, wherein the shaped stop layer is formed of $Si_3N_4$, SiCN, or copper-doped silicon nitride.

9. A semiconductor film stack having a contact structure, comprising:
   a first plurality of layers having a top surface and a contact layer;
   a second plurality of layers having a bottom surface, the second plurality of layers being disposed above the first plurality of layers;
   a shaped stop layer disposed between the first plurality of layers and the second plurality of layers, wherein the shaped stop layer has formed therein a trench having an upper width and a lower width, the lower width being smaller than the upper width, the trench having tapered sidewalls, the tapered sidewalls extending through the entire shaped stop layer from the bottom surface of the second plurality of layers to the top surface of the first plurality of layers;
   a relatively large contact hole in the second plurality of layers; and
   a relatively small contact hole extending downward from a lower extent of the trench to the contact layer, the small contact hole having a cross-section substantially the same as the lower width of the trench and an aspect ratio in a range of about 10 to about 200.

10. The semiconductor film stack as set forth in claim 9, wherein the large contact hole is disposed above the trench, aligned with the trench, extends downward to an upper extent of the trench and has a cross-section substantially the same as the upper width of the trench.

11. The semiconductor film stack as set forth in claim 9, wherein:
   a critical dimension of the large contact hole ranges from about 10 nm to about 200 nm; and
   a shape of the large contact hole is bowing, vertical or reentrant.

12. The semiconductor film stack as set forth in claim 11, wherein the small contact hole is disposed below the trench and is aligned with the trench.

13. The semiconductor film stack as set forth in claim 12, wherein:
   a critical dimension of the small contact hole ranges from about 10 nm to about 100 nm; and
   a shape of the small contact hole is bowing, vertical or reentrant.

14. The semiconductor film stack as set forth in claim 9, wherein the first plurality of layers comprises:
   a zero oxide layer;
   an oxide layer disposed above the zero oxide layer;
   a first silicon nitride layer disposed above the oxide layer; and
   one of a borophosphosilicate glass layer and a high-density plasma oxide layer disposed above the first silicon nitride layer.

15. The semiconductor film stack as set forth in claim 14, wherein the shaped stop layer is formed of is formed of $Si_3N_4$, SiCN, or copper-doped silicon nitride.

* * * * *

UNITED STATES PATENT AND TRADEMARK OFFICE
CERTIFICATE OF CORRECTION

PATENT NO.         : 9,224,803 B2
APPLICATION NO.    : 13/875998
DATED              : December 29, 2015
INVENTOR(S)        : Zusing Yang, Fang-Hao Hsu and Hong-Ji Lee Page 1 of 1

It is certified that error appears in the above-identified patent and that said Letters Patent is hereby corrected as shown below:

In the claims

Column 9, line 28, Claim 6, delete "10 to about 200." and insert -- 10 nm to about 200 nm. --.

Column 10, line 14, Claim 9, delete "10 to about 200." and insert -- 10 nm to about 200 nm. --.

Column 10, line 45, Claim 15, before "is formed of" delete "is formed of".

Signed and Sealed this
Fifteenth Day of March, 2016

Michelle K. Lee
*Director of the United States Patent and Trademark Office*